United States Patent
Chung et al.

(10) Patent No.: US 12,156,381 B2
(45) Date of Patent: Nov. 26, 2024

(54) HEAT DISSIPATION DEVICE OF ELECTRONIC EQUIPMENT

(71) Applicant: TECHWAY INDUSTRIAL CO., LTD., Taichung (TW)

(72) Inventors: Fu Hsiang Chung, Taichung (TW); Hong Fang Chen, Taichung (TW); Chun Tse Chan, Taichung (TW)

(73) Assignee: TECHWAY INDUSTRIAL CO., LTD., Taichung (TW)

( * ) Notice: Subject to any disclaimer, the term of this patent is extended or adjusted under 35 U.S.C. 154(b) by 209 days.

(21) Appl. No.: 17/984,279

(22) Filed: Nov. 10, 2022

(65) Prior Publication Data
US 2024/0164062 A1 May 16, 2024

(51) Int. Cl.
*H05K 7/20* (2006.01)

(52) U.S. Cl.
CPC ..... *H05K 7/20409* (2013.01); *H05K 7/20172* (2013.01); *H05K 7/20454* (2013.01); *H05K 7/205* (2013.01)

(58) Field of Classification Search
CPC .......... H05K 7/20172; H05K 7/20409; H05K 7/20454; H05K 7/205
See application file for complete search history.

(56) References Cited

U.S. PATENT DOCUMENTS

| | | | | |
|---|---|---|---|---|
| 6,724,631 B2* | 4/2004 | Ye | ........................... | H01L 23/42 257/E23.101 |
| 7,057,891 B2* | 6/2006 | Ito | ...................... | H01L 23/3677 428/458 |
| 7,180,745 B2* | 2/2007 | Mandel | ............... | H01L 21/4878 361/705 |
| 7,352,585 B2* | 4/2008 | Mandel | ................. | H01L 23/427 257/E23.105 |
| 7,800,907 B2* | 9/2010 | Huang | ................ | F28D 15/0233 165/80.4 |
| 7,885,071 B2* | 2/2011 | Huang | ............... | H05K 7/20336 174/16.3 |
| 7,924,565 B2* | 4/2011 | Huang | ............... | H05K 7/20336 174/547 |
| 8,081,463 B2* | 12/2011 | Chiu-Mao | .......... | H05K 7/20218 174/15.1 |
| 8,422,231 B2* | 4/2013 | Huang | ............... | H05K 7/20218 361/709 |
| 10,314,160 B2* | 6/2019 | Suzuki | ..................... | H05K 1/18 |

FOREIGN PATENT DOCUMENTS

| CN | 109496462 A | 3/2019 |
|---|---|---|
| TW | M324399 U | 12/2007 |

* cited by examiner

*Primary Examiner* — Robert J Hoffberg
(74) *Attorney, Agent, or Firm* — WPAT, P.C

(57) ABSTRACT

A heat dissipation device of electronic equipment has a base, a heat dissipation group, and a cover. The base has an opening, a chamber, and a boss formed in the chamber. The heat dissipation group is connected to the base and has a circuit board and a cooling blade. The circuit board is mounted in the chamber, abuts against the boss, and has a heat source area and at least one non-heat-source area. The heat source area has a first surface facing the boss and a second surface facing the opening. The cooling blade is connected to the base and is located at the second surface. The first surface and the second surface of the heat source area respectively correspond to the boss and the cooling blade in location to provide a guiding direction for heat conduction. The cover is connected to the base.

14 Claims, 7 Drawing Sheets

HEAT DISSIPATION DEVICE OF ELECTRONIC EQUIPMENT

BACKGROUND OF THE INVENTION

1. Field of the Invention

The present invention relates to a heat dissipation device of electronic equipment, and more particularly to a heat dissipation device for driving control equipment that can form a spatial correspondence in a simplified structure configuration accord to positions of heat source areas of electronic components of an electronic equipment, and heat can be concentrated and guided according to the heat source areas of the electronic components, and thermal pastes can be attached to the heat source areas to save cost and improve heating dissipation effect.

2. Description of Related Art

In response to climate change, energy shortage and rising awareness of environmental protection, the development of electric technology and transportation means is accelerated, and conventional driving control equipment can provide the power required for the operation of electric transportation means, which can greatly reduce or avoid the emission of carbon dioxide and harmful substances, and achieve the green environmental protection. In order to prevent humidity and external impurities in the conventional driving control equipment from corroding or damaging electronic components inside the conventional driving control equipment, the conventional driving control equipment is manufactured and assembled in a closed design. Although the closed design can achieve waterproof and dustproof effects, the heat generated by the electronic components inside the conventional driving control equipment must be dissipated and removed to prevent the high temperature caused by the heat from affecting the operation of the electronic components.

The conventional drive control equipment mainly adopts an air-cooled or liquid-cooled type as a heat dissipation mechanism. Among them, the air-cooled type uses a fan with heat dissipation fins to dissipate heat, and a thermal paste is attached to a surface of the electronic components such as a circuit board (the entire upper surface, the entire lower surface or the entire upper and lower surfaces) to conduct heat conduction through the thermal paste, and then the heat generated inside the conventional driving control equipment is conducted and then discharged to the outside, so that the conventional driving control equipment can be maintained at a normal temperature to operate.

However, when the conventional driving control device is in use, the electronic components (such as circuit boards, etc.) located inside the conventional driving control equipment are completely abutted against a body of the conventional driving control device, and in order to conduct the heat generated by the circuit board, the thermal paste will be attached to the entire lower surface of the circuit board. Although the attached thermal paste can provide a heat conduction effect, not every part of the circuit board will generate heat. Therefore, the method of attaching the thermal paste to the entire lower surface of the circuit board will increase the cost and time required for manufacturing and assembly, and cannot effectively concentrate or guide the generated heat, so that the heat will be conducted outward in an unspecified direction, which will relatively affect the overall heat dissipation effect of the conventional driving control equipment. Therefore, the conventional driving control equipment needs improvement.

SUMMARY OF THE INVENTION

The main objective of the present invention is to provide a heat dissipation device of electronic equipment that can form a spatial correspondence in a simplified structure configuration accord to positions of heat source areas of electronic components of an electronic equipment, and heat can be concentrated and guided according to the heat source areas of the electronic components, and thermal pastes can be attached to the heat source areas to save cost and improve heating dissipation effect.

The heat dissipation device of electronic equipment in accordance with the present invention has a base, a heat dissipation group, and a cover. The base has an opening, a chamber, and a boss formed in the chamber. The heat dissipation group is connected to the base and has a circuit board and a cooling blade. The circuit board is mounted in the chamber, abuts against the boss, and has a heat source area and at least one non-heat-source area. The heat source area has a first surface facing the boss and a second surface facing the opening. The cooling blade is connected to the base and is located at the second surface. The first surface and the second surface of the heat source area respectively correspond to the boss and the cooling blade in location to provide a guiding direction for heat conduction. The cover is connected to the base to cover the heat dissipation group therebetween.

Other objects, advantages and novel features of the invention will become more apparent from the following detailed description when taken in conjunction with the accompanying drawings.

DETAILED DESCRIPTION OF THE PREFERRED EMBODIMENT

Figure 1:
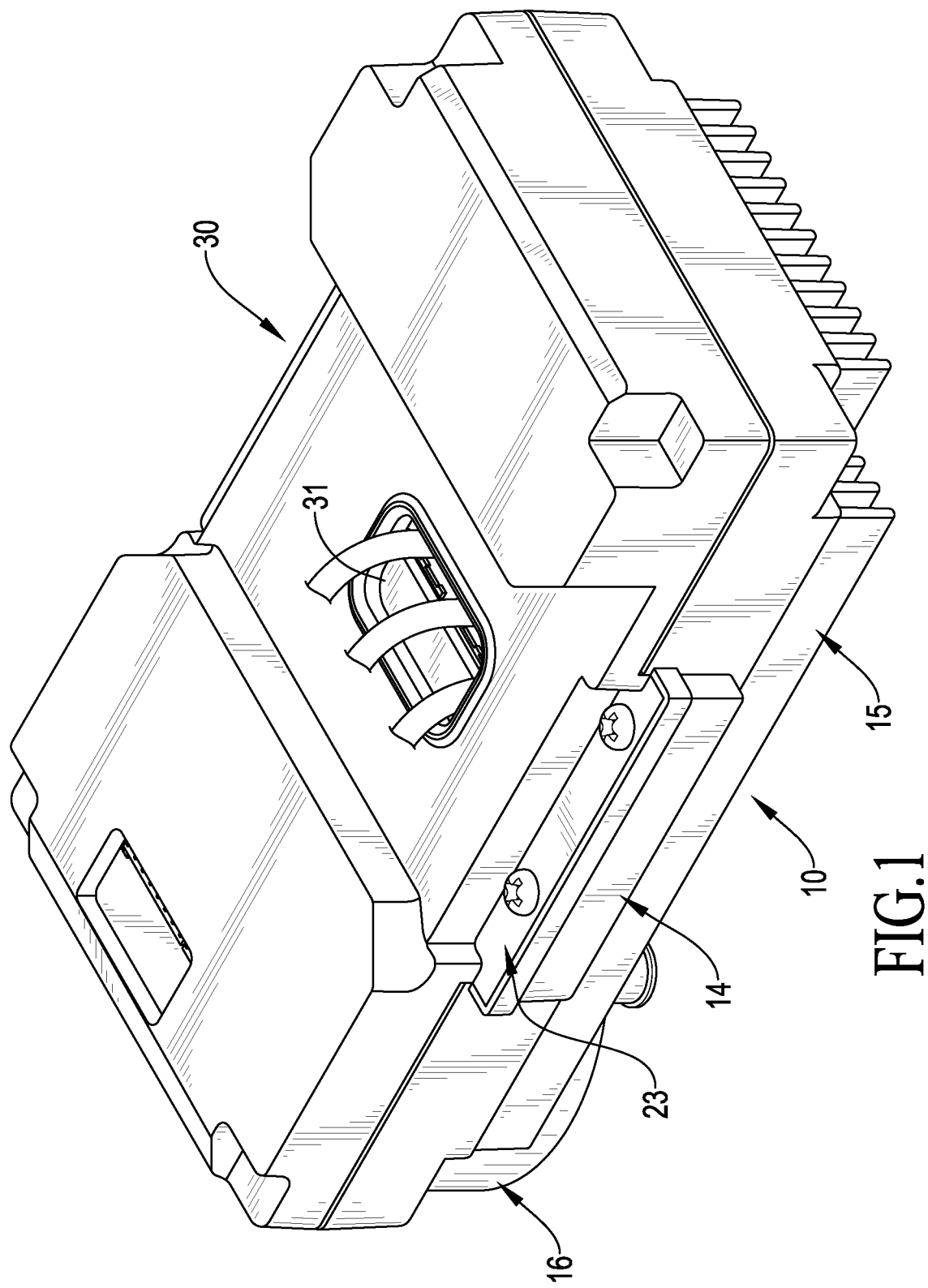
FIG. 1 is a perspective view of a heat dissipation device of electronic equipment in accordance with the present invention.
Figure 2:
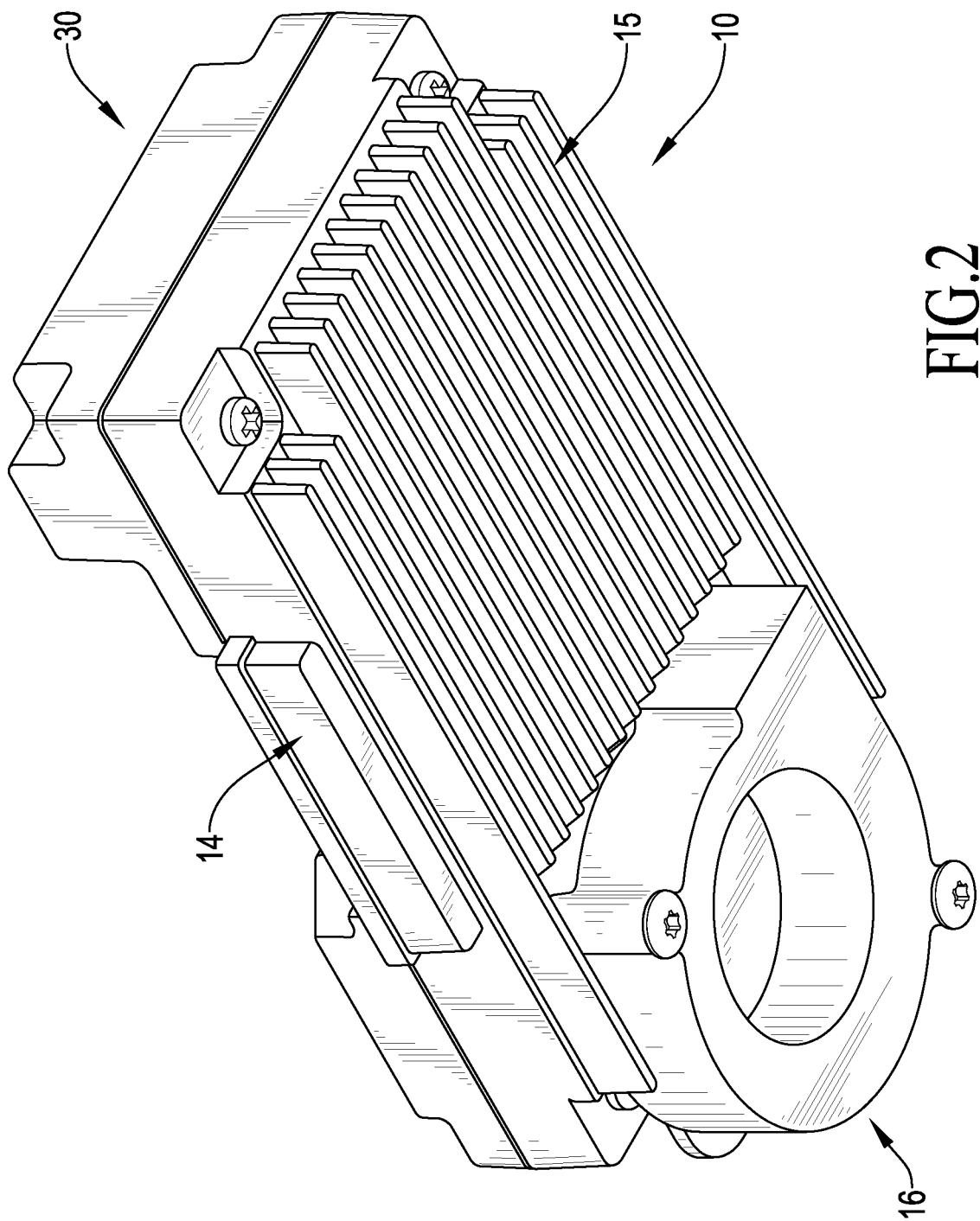
FIG. 2 is another perspective view of the heat dissipation device of electronic equipment in FIG. 1.

With reference to FIGS. 1 to 4, a heat dissipation device of electronic equipment in accordance with the present invention is applied to an electric vehicle (such as an electric vehicle, an electric motorcycle, an electric bicycle, etc.) to dissipate heat from the electronic equipment of the electric vehicle, and has a base 10, a heat dissipation group 20, and a cover 30.

The base 10 has an opening 11, a chamber 12, a boss 13, and two connecting annular flanges 14. The opening 11 is formed in a top surface of the base 10. The chamber 12 is formed in the base 10, communicates with the opening 11, and has a bottom surface. The boss 13 is formed on and protrudes from the bottom surface of the chamber 12 and extends to the opening 11. A stepper is formed between a top surface of the boss 13 and the bottom surface of the chamber 12. Preferably, the boss 13 is formed in a middle portion of the base 10 to divide the chamber 12 into two heat dissipation spaces 121. Furthermore, the boss 13 may be formed on the base 10 as a single piece. The boss 13 has an avoidance recess 131 formed in the top surface of the boss 13. The two connecting annular flanges 14 are transversally formed on and protruded from a peripheral wall of the base 10 adjacent to the opening 11 and are respectively disposed at two opposite sides of the boss 13. An assembly space 141 is formed between the two connecting annular flanges 14. The assembly space 141 has a contour corresponding to a shape of the boss 13 and is located above the boss 13. The base 10 has multiple cooling fins 15 formed on and protruded from a bottom surface of the base 10 at spaced intervals and being opposite to the opening 11. The base 10 has a connecting mount 16 disposed on the bottom surface of the base 10 for connecting a fan securely on the base 10.

Figure 5:
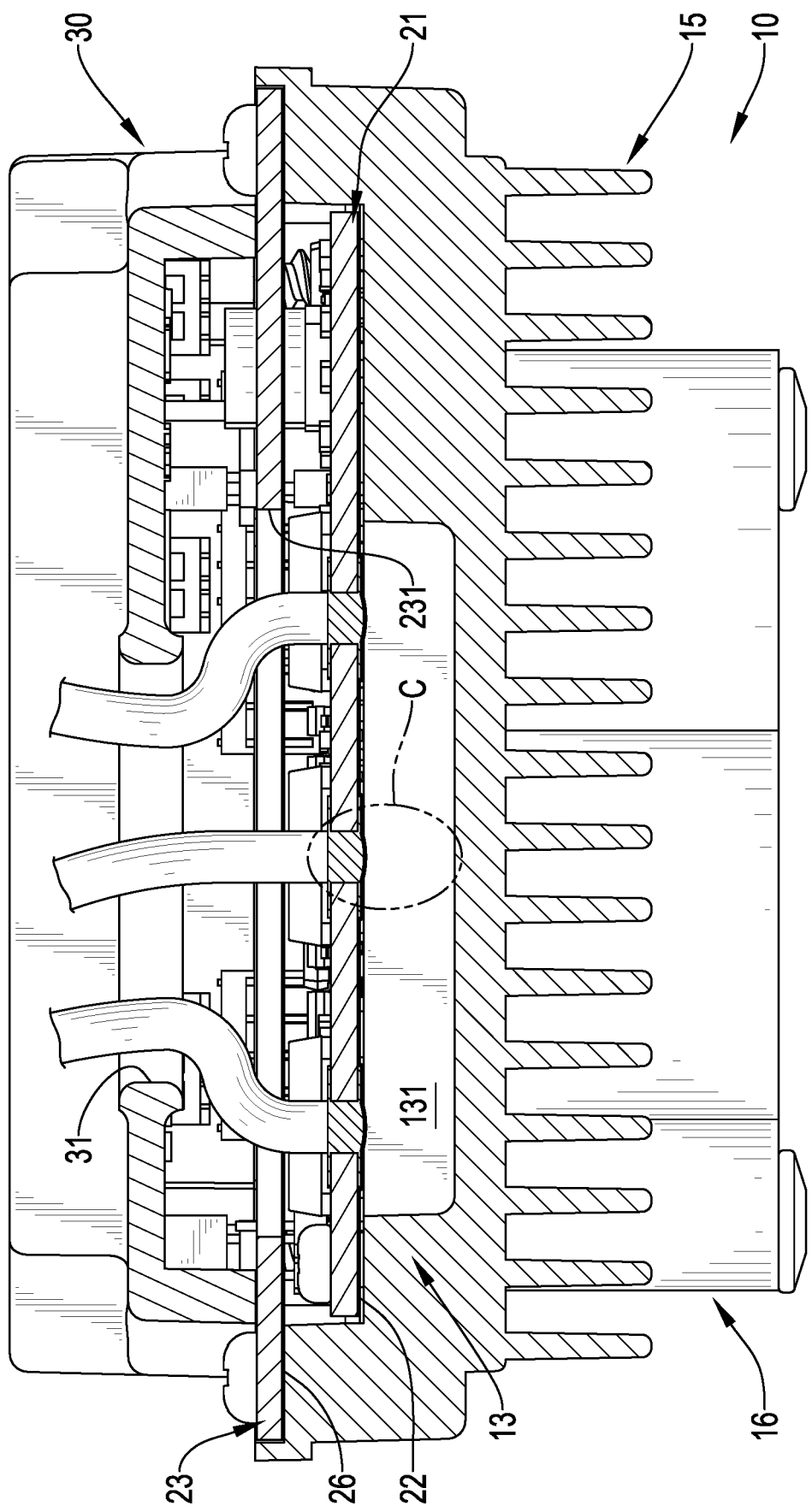
FIG. 5 is a side view of the heat dissipation device of electronic equipment along line 5-5 in FIG. 4.

The heat dissipation group 20 is connected to the base 10 and has a circuit board 21, a thermal paste 22, and a cooling blade 23. The circuit board 21 is mounted in the chamber 12 of the base 10 via the opening 11 and abuts against the boss 13. With reference to FIG. 5, solder protruding from a welding line of the circuit board 21 is located at the avoidance recess 131 of the boss 13, so as to prevent the protruding solder from affecting the abutment relationship between the circuit board 21 and the boss 13. The position and range of the welding line of the circuit board 21 can be adjusted and designed to facilitate the protruding solder to accurately locate in the avoidance recess 131 without affecting the abutment relationship between the circuit board 21 and the boss 13. The circuit board 21 has a heat source area 24 and at least one non-heat-source area 25. A range of the heat source area 24 corresponds to the shape of the boss 13, and the heat source area 24 has a first surface 241 and a second surface 242. The first surface 241 of the heat source area 24 faces the top surface of the boss 13. The second surface 242 of the heat source area 24 faces the opening 13 of the base 10. The at least one non-heat-source area 25 corresponds to one of the heat dissipation spaces 121 of the chamber 12.

Figure 7:
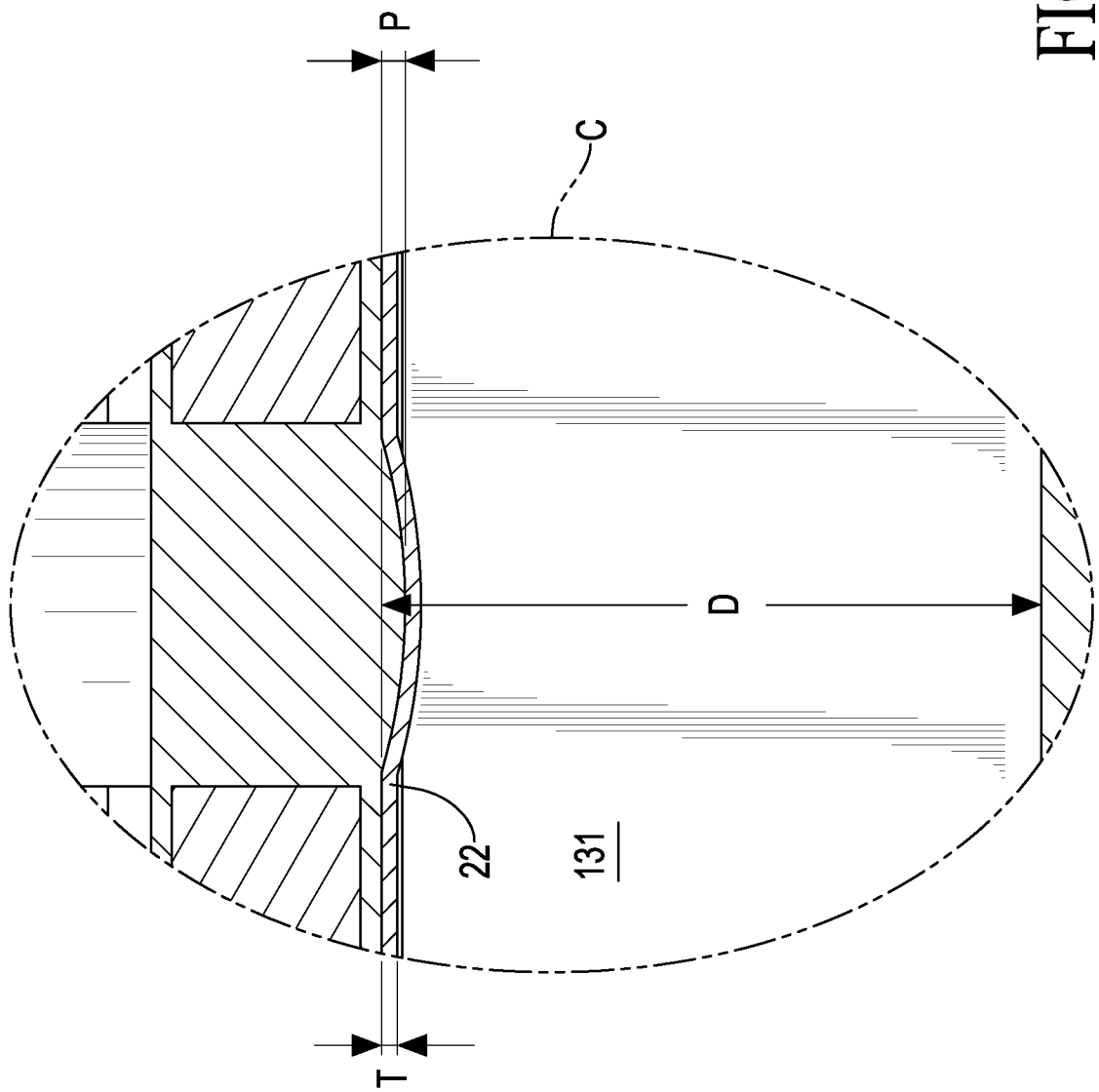
FIG. 7 is an enlarged side view of the heat dissipation device of electronic equipment in FIG. 5 in an encircled area C.

The thermal paste 22 is attached on the first surface 241 of the heat source area 24 and abuts against the top surface of the boss 13. The cooling blade 23 is connected to the two connecting annular flanges 14 of the base 10, is disposed in the assembly space 141, and is located above the second surface 242 of the heat source area 24 of the circuit board 21. Preferably, the cooling blade 23 has a through hole 231 formed through the cooling blade 23 and corresponding to the avoidance recess 131 of the boss 13. Furthermore, the heat dissipation group 20 has an auxiliary thermal paste 26 attached on a side face of the cooling blade 23 that faces the second surface 242 of the heat source area 24 and abuts against the second surface 242 of the heat source area 24. Additionally, the location of the avoidance recess 131 can be adjusted and designed according to the position and range of the protruding solder. With reference to an encircled area C in FIG. 5 and FIG. 7, the avoidance recess 13 has a depth D, the thermal paste 22 has a thickness T, and the protruding solder has a protruding height P relative to the bottom surface of the circuit board 21. The sum of the thickness T of the thermal paste 22 and the protruding height P of the protruding solder is less than or equal to the depth D of the avoidance recess 131 (i.e. $T+P \leq D$). So the contact between the circuit board 21 and the top surface of the boss 13 will not be affected by the protruding solder or other protrusions. In addition, with reference to FIG. 3, the heat dissipation group 20 may be provided with at least one auxiliary heat sink on the at least one non-heat-source area 25 of the circuit board 21.

The cover 30 is connected to the base 10 to cover the heat dissipation group therebetween, and has a through slot 31 formed through the cover 30 and corresponding to the through hole 231 of the cooling blade 23. Then the welding lines of the circuit board 21 can extend out of the heat dissipation device of electronic equipment via the through hole 231 of the cooling blade 23 and the through slot 31 of the cover 30.

Figure 3:
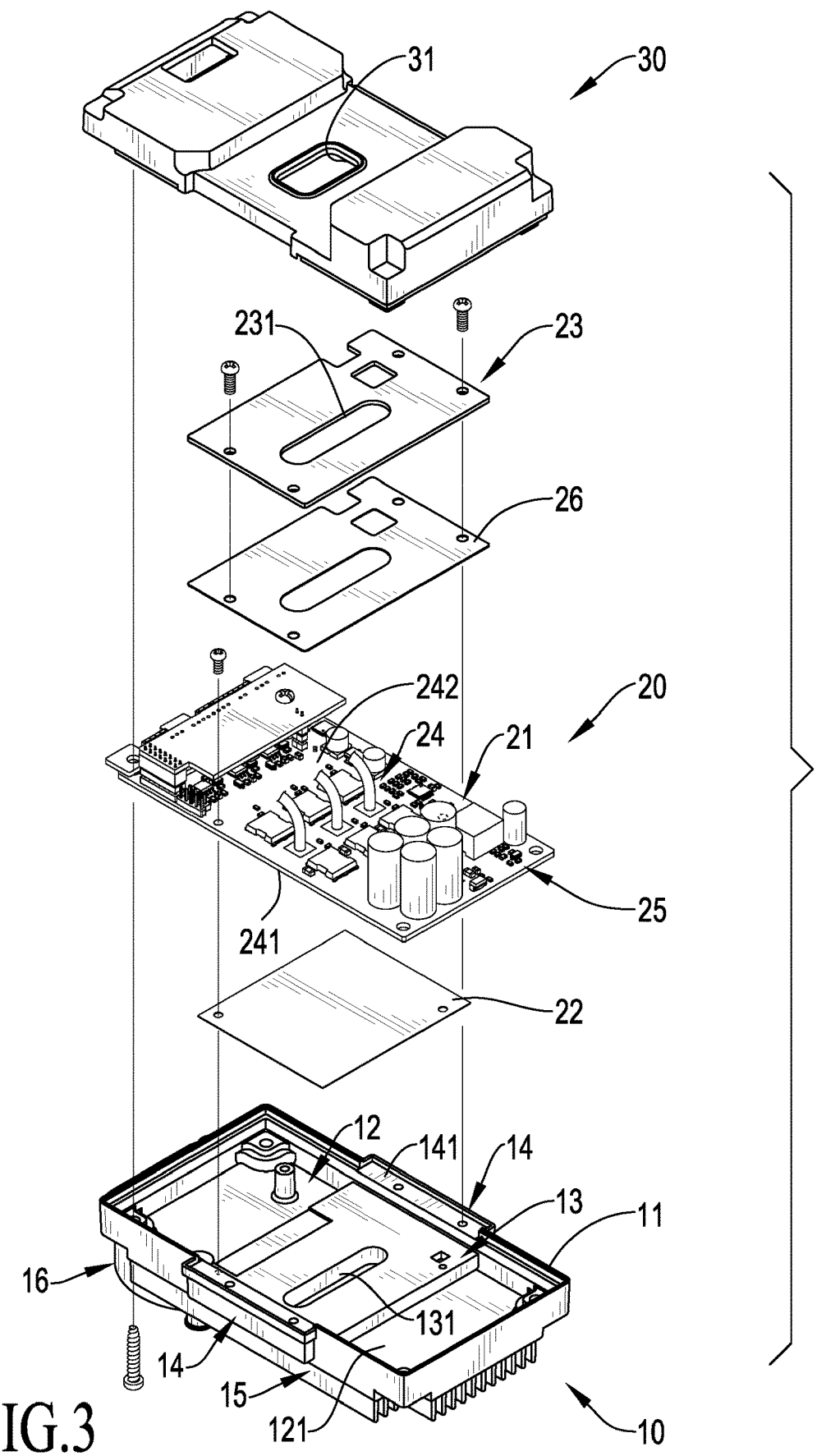
FIG. 3 is an exploded perspective view of the heat dissipation device of electronic equipment in FIG. 1.
Figure 4:
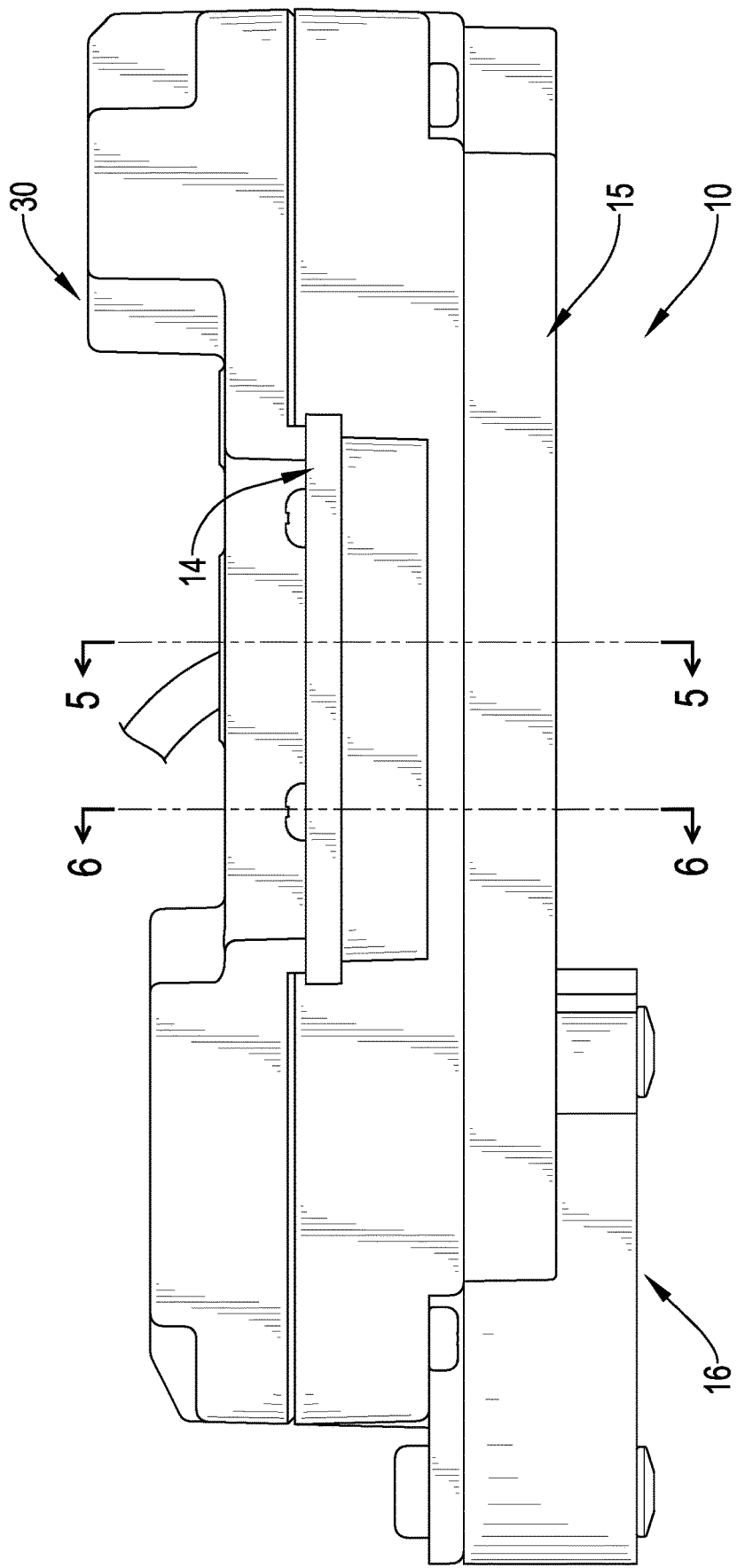
FIG. 4 is a side view of the heat dissipation device of electronic equipment in FIG. 1.
Figure 6:
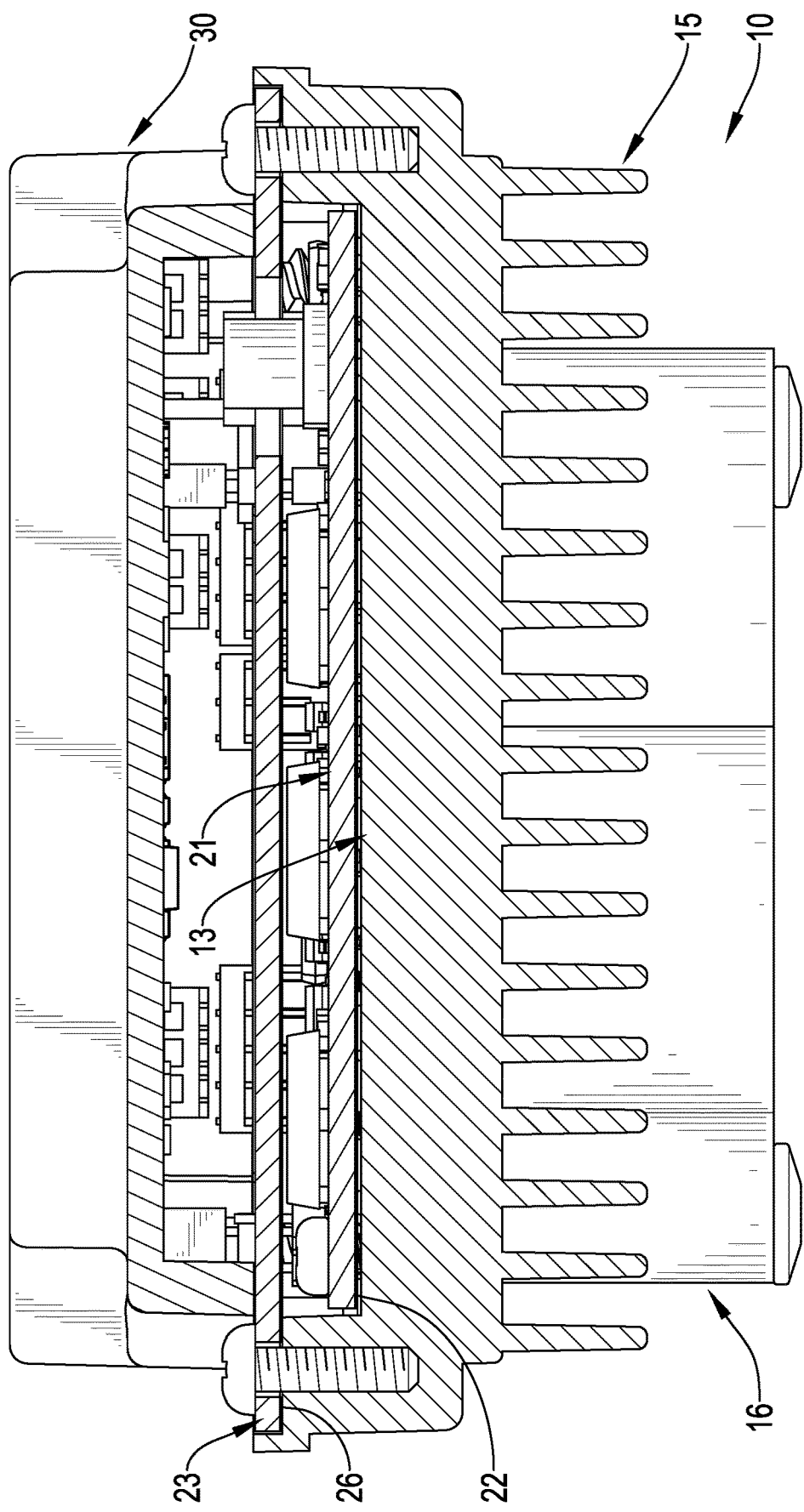
FIG. 6 is a side view of the heat dissipation device of electronic equipment along line 6-6 in FIG. 4.

With reference to FIGS. 3, 5, and 6, when assembling or manufacturing the heat dissipation device of electronic equipment of the present invention, the boss 13 corresponding to the heat source area 24 can be arranged on the base 10 according to the position, contour, and range of the heat source area 24 of the circuit board 21 of the heat dissipation group 20, the thermal paste 22 is attached to the first surface 241 that is in contact with the boss 13, and the cooling blade 23 corresponds to the heat source area 24 in size and spatial position and is attached with an auxiliary thermal paste 26 that is in contact with the second surface 242. Precisely according to the heat source area 24 of the circuit board 21, the boss 13, the thermal paste 22, the cooling blade 23, and the auxiliary thermal paste 26 are arranged.

Then the heat energy generated after the operation of the electronic equipment of the present invention can be arranged through the above-mentioned spatial and structural relationships, so as to concentrate or guide conduction and heat dissipation for thermal energy and can reduce the influence of the heat source area 24 on the non-heat-source area 25. The heat dissipation device of electronic equipment of the present invention can effectively improve the conduction and heat dissipation of heat energy in an unspecified direction, which affects the overall heat dissipation effect, and it is not necessary to attach the redundant thermal paste 22 and the auxiliary thermal paste 26 to the non-heat-source area 25, which can greatly reduce the cost and time of manufacture and assembly, so as to provide a heat dissipation device of electronic equipment that can save cost and improve heat dissipation effect.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A heat dissipation device of electronic equipment comprising:
   a base having
      an opening formed in a top surface of the base;
      a chamber formed in the base, communicating with the opening, and having a bottom surface;
      a boss formed on and protruded from the bottom surface of the chamber and extended to the opening;
      two connecting annular flanges transversally formed on and protruded from a peripheral wall of the base adjacent to the opening and respectively disposed at two opposite sides of the boss; and wherein the chamber includes an assembly space formed between the two connecting annular flanges, has a contour corresponding to a shape of the boss, and is located above the boss and the two connecting annular flanges;

a heat dissipation group connected to the base and having
  a circuit board mounted in the chamber, abutted against the boss, and having
    a heat source area corresponding to the boss and having
      a first surface facing a top surface of the boss; and
      a second surface facing the opening; and
    at least one non-heat-source area located on a side of the heat source area; and
  a cooling blade connected to the two connecting annular flanges of the base and disposed in the assembly space at the second surface of the heat source area of the circuit board;

wherein the first surface of the heat source area of the circuit board corresponds to the boss and provides a first guiding direction for heat conduction from the heat source area to the boss of the base, and the second surface of the heat source area of the circuit board corresponds to the cooling blade and provides a second guiding direction for heat conduction from the heat source area through the cooling blade to the base; and a cover connected to the base and covering the opening of the base, the heat dissipation group and the cooling plate located between the base and the cover.

2. The heat dissipation device of electronic equipment as claimed in claim 1, wherein the heat dissipation group has
  a thermal paste attached on the first surface of the heat source area and abutted against the top surface of the boss; and
  an auxiliary thermal paste attached on a side face of the cooling blade that faces the second surface of the heat source area and abuts against the second surface of the heat source area.

3. The heat dissipation device of electronic equipment as claimed in claim 2, wherein the boss has an avoidance recess formed in the top surface of the boss to receive a protruding solder of a welding line of the circuit board.

4. The heat dissipation device of electronic equipment as claimed in claim 3, wherein
  the cooling blade has a through hole formed through the cooling blade and corresponding to the avoidance recess of the boss; and
  the cover has a through slot formed through the cover and corresponding to the through hole of the cooling blade.

5. The heat dissipation device of electronic equipment as claimed in claim 4, wherein
  the boss is formed in a middle portion of the base to divide the chamber into two heat dissipation spaces; and
  the at least one non-heat-source area of the circuit board corresponds to one of the two heat dissipation spaces of the chamber.

6. The heat dissipation device of electronic equipment as claimed in claim 5, wherein the base has multiple cooling fins formed on and protruded from a bottom surface of the base at spaced intervals and being opposite to the opening.

7. The heat dissipation device of electronic equipment as claimed in claim 6, wherein the base has a connecting mount disposed on the bottom surface of the base for connecting a fan securely on the base.

8. The heat dissipation device of electronic equipment as claimed in claim 2, wherein the base has
  multiple cooling fins formed on and protruded from a bottom surface of the base at spaced intervals and being opposite to the opening; and
  a connecting mount disposed on the bottom surface of the base for connecting a fan securely on the base.

9. The heat dissipation device of electronic equipment as claimed in claim 1, wherein the boss has an avoidance recess formed in the top surface of the boss to receive a protruding solder of a welding line of the circuit board.

10. The heat dissipation device of electronic equipment as claimed in claim 9, wherein
  the cooling blade has a through hole formed through the cooling blade and corresponding to the avoidance recess of the boss; and
  the cover has a through slot formed through the cover and corresponding to the through hole of the cooling blade.

11. The heat dissipation device of electronic equipment as claimed in claim 10, wherein
  the boss is formed in a middle portion of the base to divide the chamber into two heat dissipation spaces; and
  the at least one non-heat-source area of the circuit board corresponds to one of the two heat dissipation spaces of the chamber.

12. The heat dissipation device of electronic equipment as claimed in claim 11, wherein the base has multiple cooling fins formed on and protruded from a bottom surface of the base at spaced intervals and being opposite to the opening.

13. The heat dissipation device of electronic equipment as claimed in claim 6, wherein the base has a connecting mount disposed on the bottom surface of the base for connecting a fan securely on the base.

14. The heat dissipation device of electronic equipment as claimed in claim 1, wherein the base has
  multiple cooling fins formed on and protruded from a bottom surface of the base at spaced intervals and being opposite to the opening; and
  a connecting mount disposed on the bottom surface of the base for connecting a fan securely on the base.

\* \* \* \* \*